(12) United States Patent
Krieger et al.

(10) Patent No.: US 9,032,250 B1
(45) Date of Patent: May 12, 2015

(54) ONLINE TESTING OF SECONDARY POWER UNIT

(71) Applicant: Google Inc., Mountain View, CA (US)

(72) Inventors: Ken Krieger, Jackson, WY (US); Sangsun Kim, San Jose, CA (US)

(73) Assignee: Google Inc., Mountain View, CA (US)

(*) Notice: Subject to any disclaimer, the term of this patent is extended or adjusted under 35 U.S.C. 154(b) by 221 days.

(21) Appl. No.: 13/668,473

(22) Filed: Nov. 5, 2012

(51) Int. Cl.
*G06F 11/00* (2006.01)
*G01R 19/22* (2006.01)

(52) U.S. Cl.
CPC ..................................... *G01R 19/22* (2013.01)

(58) Field of Classification Search
USPC .......................................................... 714/14
See application file for complete search history.

(56) References Cited

U.S. PATENT DOCUMENTS

| | | |
|---|---|---|
| 3,757,131 A | 9/1973 | Krutz et al. |
| 4,749,881 A | 6/1988 | Ulrich |
| 4,809,151 A | 2/1989 | Ota |
| 5,119,014 A | 6/1992 | Kronberg |
| 5,458,991 A | 10/1995 | Severinsky |
| 5,579,522 A | 11/1996 | Christeson et al. |
| 5,694,307 A | 12/1997 | Murugan |
| 5,715,154 A | 2/1998 | Rault |
| 5,757,166 A | 5/1998 | Sodhi |
| 5,789,828 A | 8/1998 | Tremaine et al. |
| 5,821,636 A | 10/1998 | Baker et al. |
| 5,844,884 A | 12/1998 | Szlenski |
| 6,009,177 A | 12/1999 | Sudia |
| 6,076,142 A | 6/2000 | Corrington et al. |
| 6,157,168 A | 12/2000 | Malik |
| 6,204,574 B1 | 3/2001 | Chi |
| 6,225,708 B1 | 5/2001 | Furukawa et al. |
| 6,289,684 B1 | 9/2001 | Guidry, II et al. |
| 6,366,919 B2 | 4/2002 | O'Kane et al. |
| 6,374,627 B1 | 4/2002 | Schumacher et al. |

(Continued)

FOREIGN PATENT DOCUMENTS

| | | |
|---|---|---|
| CA | 2653778 | 3/2013 |
| CN | 1053161 | 7/1991 |

(Continued)

OTHER PUBLICATIONS

"Circuit Converts PWM Fan Drive to Linear and Reduces Acoustic Noise," [online] [retrieved on Oct. 23, 2006] Maxim/Dallas Semiconductor, 2006, Retrieved from the Internet URL: www.maxim-ic.com/appnotes.cfm/an_pk/3530, 3 pages.

(Continued)

*Primary Examiner* — Bryce Bonzo
*Assistant Examiner* — Elmira Mehrmanesh
(74) *Attorney, Agent, or Firm* — Fish & Richardson P.C.

(57) ABSTRACT

A power delivery system includes a power supply unit, a secondary power unit, a controller, and a monitor. The power supply unit is configured to receive primary power and provide operating DC power to a DC load. The secondary power unit is configured to store energy from the primary power. The controller is configured to control the secondary power unit during a testing period such that the secondary power unit uses the stored energy to provide secondary DC power to the load instead of the operating DC power. The monitor is configured to monitor the operation of the secondary power unit during the testing period and provide a signal indicative of whether the secondary power unit operated within defined parameters during the testing period.

26 Claims, 4 Drawing Sheets

(56) References Cited

U.S. PATENT DOCUMENTS

| | | | |
|---|---|---|---|
| 6,429,706 | B1 | 8/2002 | Amin et al. |
| 6,496,366 | B1 | 12/2002 | Coglitore et al. |
| 6,506,111 | B2 | 1/2003 | Sharp et al. |
| 6,584,559 | B1 | 6/2003 | Huh |
| 6,617,708 | B2 | 9/2003 | Boost |
| 6,652,373 | B2 | 11/2003 | Sharp et al. |
| 6,652,374 | B2 | 11/2003 | Sharp et al. |
| 6,667,891 | B2 | 12/2003 | Coglitore et al. |
| 6,668,565 | B1 | 12/2003 | Johnson et al. |
| 6,741,467 | B2 | 5/2004 | Coglitore et al. |
| 6,768,222 | B1 | 7/2004 | Ricks |
| 6,822,859 | B2 | 11/2004 | Coglitore et al. |
| 6,824,362 | B2 | 11/2004 | Dodson, III |
| 6,850,408 | B1 | 2/2005 | Coglitore et al. |
| 6,859,366 | B2 | 2/2005 | Fink |
| 6,880,349 | B2 | 4/2005 | Johnson et al. |
| 6,935,130 | B2 | 8/2005 | Cheng et al. |
| 6,937,947 | B2 | 8/2005 | Trembley |
| 6,967,283 | B2 | 11/2005 | Rasmussen et al. |
| 6,969,922 | B2 | 11/2005 | Welches et al. |
| 6,985,357 | B2 | 1/2006 | Cauthron |
| 7,011,576 | B2 | 3/2006 | Sharp et al. |
| 7,102,341 | B1 | 9/2006 | Choudhury |
| 7,123,477 | B2 | 10/2006 | Coglitore et al. |
| 7,145,772 | B2 | 12/2006 | Fink |
| 7,173,821 | B2 | 2/2007 | Coglitore et al. |
| 7,560,831 | B2 * | 7/2009 | Whitted et al. .......... 307/64 |
| 7,870,379 | B2 | 1/2011 | Krieger et al. |
| 7,886,173 | B2 * | 2/2011 | Krieger et al. ......... 713/330 |
| 8,080,900 | B2 | 12/2011 | Corhodzic et al. |
| 8,566,639 | B2 * | 10/2013 | Moshayedi et al. ....... 714/14 |
| 8,624,433 | B2 | 1/2014 | Whitted et al. |
| 8,648,568 | B2 * | 2/2014 | McCollum et al. ...... 320/116 |
| 2003/0133263 | A1 | 7/2003 | Shu |
| 2003/0197428 | A1 | 10/2003 | Hatton et al. |
| 2003/0237008 | A1 | 12/2003 | Freevol et al. |
| 2004/0010649 | A1 | 1/2004 | Weaver et al. |
| 2004/0020224 | A1 | 2/2004 | Bash et al. |
| 2004/0125626 | A1 | 7/2004 | Kanouda et al. |
| 2004/0150374 | A1 | 8/2004 | Kraus |
| 2004/0210800 | A1 | 10/2004 | Vecoven et al. |
| 2005/0012395 | A1 | 1/2005 | Eckroad et al. |
| 2005/0036248 | A1 | 2/2005 | Klikic et al. |
| 2005/0088201 | A1 | 4/2005 | Devlin |
| 2005/0099750 | A1 | 5/2005 | Takahashi et al. |
| 2005/0146223 | A1 | 7/2005 | Kanouda et al. |
| 2005/0170770 | A1 | 8/2005 | Johnson et al. |
| 2005/0174678 | A1 | 8/2005 | Zayas et al. |
| 2005/0182981 | A1 | 8/2005 | Hayashi |
| 2005/0286191 | A1 | 12/2005 | Vorenkamp et al. |
| 2006/0020832 | A1 | 1/2006 | Hung |
| 2006/0082263 | A1 | 4/2006 | Rimler et al. |
| 2006/0187600 | A1 | 8/2006 | Brown et al. |
| 2007/0047195 | A1 | 3/2007 | Merkin et al. |
| 2008/0030078 | A1 * | 2/2008 | Whitted et al. .......... 307/66 |
| 2008/0093930 | A1 | 4/2008 | Chen |
| 2009/0160255 | A1 | 6/2009 | Grady |
| 2009/0206670 | A1 | 8/2009 | Whitted et al. |
| 2012/0056481 | A1 | 3/2012 | Corhodzic et al. |
| 2014/0122906 | A1 | 5/2014 | Whitted et al. |

FOREIGN PATENT DOCUMENTS

| | | |
|---|---|---|
| CN | 1246748 | 3/2000 |
| CN | 101501596 | 8/2009 |
| CN | 101563829 | 10/2009 |
| CN | 101595442 | 12/2009 |
| CN | 101803148 | 6/2014 |
| EP | 593258 | 4/1994 |
| EP | 1355404 | 10/2003 |
| EP | 2036189 | 3/2009 |
| EP | 2038717 | 3/2009 |
| EP | 2084591 | 8/2009 |
| EP | 2174398 | 4/2010 |
| KR | 20000050874 | 8/2000 |
| KR | 1169124 | 7/2012 |
| TW | 200803113 | 1/2008 |
| WO | WO2007139577 | 12/2007 |
| WO | WO2007142656 | 12/2007 |
| WO | WO2008045044 | 4/2008 |
| WO | WO2009012451 | 1/2009 |

OTHER PUBLICATIONS

"Intelligent Temperature Monitor and PWM Fan Controller," [online] [retrieved on Oct. 24, 2006] Analog Devices, 2003, Retrieved from the Internet URL: www.analog.com/UploadedFiles/Data_Sheets/ADM1030.pdf#xml=http://search.analog.com/search/pdfPainter.aspx?url=http://www.analog.com/UploadedFiles/Data_Sheets/ADM1030.pdf&fterm=Intelligent&fterm=Temperature&fterm=IntelligentTemperature&la=en>, 28 pages.

"LM64- +-1C Remote Diode Temperature Sensor with PWM Fan Control and 5 GPIO's," [online] [retrieved on Oct. 23, 2006] National Semiconductor, 2006, Retrieved from the Internet URL: http://www.elecdesign.com/Articles/Index.cfm?ArticleID=6281>, 3 pages.

"Low-cost fan manager for power-supply applications," [online] [retrieved on Oct. 23, 2006] Electronic Design, 2006, Retrieved from the Internet URL: www.elecdesign.com/Articles/Index.cfm?ArticleID=6281>, 3 pages.

"Primary-side UPS Architecture," 2011, 3 pages.

"Protect High-Density Equipment From Thermal Damage—Guaranteed," APC Currents, 18(4), Sep. 2007, 3 pages.

"T10 Project 1142D—Working Draft SCSI Parallel Interface-2," [online] [retrieved on Oct. 23, 2006] American National Standard, 1998, Retrieved from the Internet URL: www.t10.org/ftp/t10/drafts/spi2/spi2r20b.pdf>, 3 pages.

Authorized Officer Blaine R. Copenheaver, International Search Report and Written Opinion in PCT/US2006/024880, mailed Feb. 15, 2008, 14 pages.

Authorized Officer Christine Voigt, International Search Report and Written Opinion in PCT/US2008/070475, mailed Jun. 26, 2009, 22 pages.

Authorized Officer Jacqueline A. Whitfield, International Search Report and Written Opinion in PCT/US2006/039715, mailed Nov. 5, 2007, 12 pages.

Authorized Officer Lee W. Young, International Search Report and Written Opinion in PCT/US2006/039928, mailed Jul. 31, 2007, 8 pages.

Chinese First Office Action in Chinese Application No. 200880106672.3, mailed May 3, 2012, 11 pages.

Chinese First Office Action in CN App. No. 200680055429.4, mailed May 12, 2010, 19 pages.

Chinese First Office Action in CN App. No. 200680055448.7, mailed Apr. 19, 2011, 4 pages.

Chinese Notice of Grant in CN App. No. 200680055429.4, mailed Jan. 16, 2012, 4 pages.

Chinese Notice of Grant in CN App. No. 200680056577.8, mailed Feb. 15, 2012, 4 pages.

Chinese Notification of Grant in CN App. No. 200680055448.7, mailed Feb. 22, 2012, 4 pages.

Chinese Notification of Grant in CN App. No. 200880106672.3 mailed Feb. 10, 2014, 4 pages.

Chinese Office Action in CN App. No. 200680056577.8, mailed May 4, 2011, 4 pages.

Chinese Second Office Action in CN App. No. 200680055429.4, mailed Dec. 14, 2010, 5 pages.

Chinese Second Office Action in CN App. No. 200880106672.3 mailed Apr. 7, 2013, 9 pages.

Chinese Third Office Action in CN App. No. 200680055429.4, mailed Mar. 30, 2011, 5 pages.

Chinese Third Office Action in CN App. No. 200880106672.3 mailed Oct. 18, 2013, 6 pages.

Cringley, "Google-Mart: Sam Walton Taught Google More About How to Dominate the Internet Than Microsoft Ever Did," I, Cringely—The Pulpit, Nov. 17, 2005, 3 pages.

(56) References Cited

OTHER PUBLICATIONS

Notice of Allowance in U.S. Appl. No. 11/756,939 mailed Jan. 29, 2009, 6 pages.
Office Action in U.S. Appl. No. 12/432,567 mailed Sep. 21, 2011, 5 pages.
Notice of Allowance in U.S. Appl. No. 11/546,467, mailed Aug. 12, 2010, 7 pages.
Notice of Allowance in U.S. Appl. No. 12/432,567 mailed Sep. 5, 2013, 8 pages.
Office Action in U.S. Appl. No. 13/291,460 mailed Jan. 9, 2014, 15 pages.
Office Action in U.S. Appl. No. 12/432,567 mailed May 24, 2013, 8 pages.
Korean Notice of Allowance in KR App. No. 2009-7009579, mailed Jun. 26, 2012, 4 pages.
Korean Office Action in KR App. No. 2009-7009579, mailed Jan. 5, 2012, 10 pages.
Korean Office Action in KR App. No. 2009-7009579, mailed Mar. 5, 2012, 6 pages.
Korean Office Action in KR App. No. 10-2010-7003619, mailed May 23, 2014, 13 pages.
Notice of Allowance in U.S. Appl. No. 11/779,606 mailed Aug. 5, 2011, 9 pages.
Office Action in U.S. Appl. No. 11/779,606 mailed Jan. 21, 2010, 14 pages.
Office Action in U.S. Appl. No. 11/779,606 mailed Jun. 24, 2010, 18 pages.
Office Action in U.S. Appl. No. 11/779,606 mailed Nov. 26, 2010, 18 pages.
Canadian Notice of Allowance in CA App. No. 2,653,778, mailed Jul. 10, 2012, 1 page.
Canadian Office Action in CA App. No. 2,653,778, mailed Aug. 4, 2011, 3 pages.
European Search Report in EP App. No. 06816708, mailed Jul. 18, 2011, 3 pages.
Office Action in U.S. Appl. No. 11/545,944, mailed May 13, 2010, 13 pages.
Gu, "Distributed Monitoring System of Communication Power Supply," China Master Theses Full-Text Database, Information Technology Series, No. 3, 2003, pp. 7-8.
Guralp Systems, "Serial Server/UPS", Sep. 7, 2005, 11 pages.
Hamilton, "An Architecture for Modular Data Centers," Microsoft Corp,CIDR 2007. 3rd Biennial Conference on Innovative Data Systems Research (CIDR) Jan. 7-10, 2007, Asilomar, California, USA pp. 306-313.
Hamilton, "Commodity Data Center Design," Microsoft Corp, Apr. 17, 2007, 11 pages.
JP Patent 11-225835, Kira et al., English translation, Aug. 24, 1999, 15 pages.
Li, "Application of Automatic Changeover Switch in UPS Power Supply System," Financial Computing in China, No. 3, 2005, pp. 69-70.
Loeffler, "Maximizing UPS Availability," Eaton Powering Business Worldwide, [online][Retrieved on Jan. 2011]; Retrieved from the Internet URL: www.eaton.com/powerquality, 12 pages.
Matter, "The Industrial Revolution, Finally," [online] available at: http://blogs.sun.com/Gregp/date/200610, Oct. 17, 2006, 5 pages.
Project Blackbox "Join us to preview the world's first datacenter in a box," [online] [Retrieved Oct. 19, 2006] Available at: http://www.sun.com/emrkt/blackbox/index.jsp, Sun Microsystems, Inc. 1994-2009, 3 pages.
Project Blackbox "Project Blackbox. An extraordinarily simple idea," [online] [Retrieved Oct. 19, 2006] Available at: http://www.sun.com/emrkt/blackbox/scenarios.jsp, Sun Microsystems, Inc., 1994-2007, 7 pages.
Rackable Systems, "Rackable Systems Contcentro Modular Data Center High Density, High Efficiency Mobile Computing," Datasheet, 2007, 1 page.
Rackable Systems, "Thermal Management & Server Density: Critical Issues for Today's Data Center," White paper, 2004 8 pages.
Sanmina-SCI Product Sheet, Ecobay, "High-Performance Closed-Loop System," 2006, 2 pages.
Shankland, "Sun Blackbox, meet APC's whitebox," cNet News.com, available at http://news.com.com/Sun+Blackbox%2C+meet+-APCs+whitebox/2001-1010_3-617774.html, Jan. 7, 2007, 2 pages.
Spears, "Emerging UPS Standby Power Sources," Eaton Powering Business Worldwide, [online] [Retrieved on Dec. 2009]; Retrieved from the Internet URL: www.eaton.com/powerquality, 6 pages.
Spears, "Parallel UPS configurations," Eaton Powering Business Worldwide, [online][Retrieved on Jan. 2009]; Retrieved from the Internet URL: www.eaton.com/powerquality, 10 pages.
System Management Interface Forum, "PMBus Power System Management Protocol Specification Part 1—General Requirements, Transport and Electrical Interface, Revision 1.0" Mar. 2005, 17 pages.
Taiwan Examination Report in TW App. No. 095123118 on Oct. 24, 2013, with English Translation, 4 pages.
Taiwan Examination Report in TW App. No. 095123118, mailed Nov. 5, 2013, English Translation, 4 pages.
Taiwan Examination Report in TW App. No. 095123118, mailed Oct. 2, 2012, English Translation, 3 pages.
Taiwan Notice of Allowance in TW App. No. 095123118, mailed Jun. 4, 2014, English Translation, 3 pages.
Taiwan Office Action in TW App. No. 096138047, mailed May 24, 2013, English Translation, 6 pages.

* cited by examiner

ONLINE TESTING OF SECONDARY POWER UNIT

TECHNICAL FIELD

The following disclosure relates to electrical power distribution in, for example, data centers.

BACKGROUND

Operators of data centers also want to protect their electrical devices from black-outs and brown-outs. As a result, such operators may install uninterruptible power supplies (UPS's) that can provide some level of battery back-up, either to keep a system operating throughout a power failure, or to give the system enough time to shut down safely and cleanly.

SUMMARY

In one aspect, a power delivery system includes a power supply unit, a secondary power unit, a controller, and a monitor. The power supply unit is configured to receive primary power and provide operating DC power to a DC load. The secondary power unit is configured to receive power from the primary power, store energy from the primary power, and, when the primary power is outside of a specified operating range, use the stored energy to provide secondary DC power to the load instead of the operating DC power. The controller is configured to control the secondary power unit during a testing period such that the secondary power unit uses the stored energy to provide secondary DC power to the load instead of the operating DC power while the primary power is received by the power supply unit and is within the specified operating range. The monitor is configured to monitor the operation of the secondary power unit during the testing period and provide a signal indicative of whether the secondary power unit operated within defined parameters during the testing period.

Implementations may include one or more of the following features. For example, the power supply unit may include a selection circuit. The selection circuit may be configured to select between power from the primary power and secondary power from the secondary power unit, and may be further configured to provide the selected power to the DC load. The selection circuit may also be configured to select between the power from the primary power and the secondary power based on characteristics of the power from the primary power and the secondary power.

The characteristics may include the voltage of the power from the primary power and the voltage of the secondary power. The selection circuit may be configured to select the secondary power when the voltage of the secondary power is higher than the voltage of the power from the primary power. The controller may be configured to control the secondary power unit during the testing period such that the voltage of the secondary power is higher than the voltage of the power from the primary power.

The selection circuit may include a first diode and a second diode. The anode of the first diode may be configured to receive power from the primary power and the cathode of the first diode may be configured to provide power to a node. The anode of the second diode may be configured to receive power from the secondary power unit and the cathode of the second diode may be configured to provide power to the node.

The DC load may include one or more processors. The secondary power unit may include a charger configured to receive power, an energy storage device configured to receive power from the charger and store energy from the received power, a step-up converter configured to receive power from the energy storage medium and deliver power to the selection circuit, and a primary monitoring unit configured to monitor the primary power and to control the converter based on a state of the primary power.

The primary power may include AC input power. The power supply unit may include an AC/DC stage configured to receive the AC input power and convert the received AC input power to DC power, a DC/DC stage configured to receive the DC power from the AC/DC stage and convert the received DC power to the operating DC power, and a selection circuit. The selection circuit may be configured to select between the DC power from the AC/DC stage and the secondary DC power from the secondary power unit, to provide the selected power to the DC/DC stage, and to select between the DC power from the AC/DC stage and the secondary DC power from the secondary power unit based on characteristics of the DC power from the AC/DC stage and the secondary DC power from the secondary power unit.

The characteristics may include the voltage of the DC power from the AC/DC stage and the voltage of the secondary DC power from the secondary power unit. The selection circuit may be configured to select the secondary DC power when the voltage of the secondary DC power is higher than the voltage of the DC power from the AC/DC stage. The controller may be configured to control the secondary power unit during the testing period such that the voltage of the secondary DC power is higher than the voltage of the power from the AC/DC stage.

In another aspect, a method of controlling a power delivery system that includes a power supply unit configured to receive primary power and provide operating DC power to a DC load and a secondary power unit configured to receive power from the primary power, store energy from the primary power, and, when the primary power is outside of a specified operating range, use the stored energy to provide secondary DC power to the load instead of the operating DC power includes: controlling the secondary power unit during a testing period such that the secondary power unit uses the stored energy to provide secondary DC power to the load instead of the operating DC power while the primary power is received by the power supply unit and is within the specified operating range; and receiving a signal indicative of whether the secondary power unit operated within defined parameters during the testing period.

Implementations may include one or more of the following features. For example, the power supply unit may include a selection circuit. The selection circuit may be configured to select between power from the primary power and power from the secondary power unit. The selected power may be provided to the DC load and the selection circuit may be configured to select the power from the secondary power unit when a voltage of the power from the secondary power unit is higher than a voltage of the power from the primary power. Controlling the secondary power unit during a testing period may include controlling the secondary power unit during the testing period such that the voltage of the power from the secondary power unit is higher than the voltage of the power from the primary power.

The selection circuit may include a first diode and a second diode. The anode of the first diode may be configured to receive power from the primary power and the cathode of the first diode may be configured to provide power to a node. The anode of the second diode may be configured to receive power from the secondary power unit and the cathode of the second diode may be configured to provide power to the node.

The DC load may include one or more processors. The input power may include AC input power. The power supply unit may include an AC/DC stage configured to receive the AC input power and convert the received AC input power to DC power, a DC/DC stage configured to receive the DC power from the AC/DC stage and convert the received DC power to the operating DC power, and a selection circuit. The selection circuit may be configured to select between the DC power from the AC/DC stage and the secondary DC power from the secondary power unit. The selected power may be provided to the DC/DC stage and the selection circuit may be configured to select the secondary DC power from the secondary power unit when a voltage of the secondary DC power is higher than a voltage of the DC power from the AC/DC stage. Controlling the secondary power unit during the testing period may include controlling the secondary power unit during the testing period such that the voltage of the secondary DC power from the secondary power unit is at a specified level above the DC power provided by the AC/DC stage.

Receiving the signal indicative of whether the secondary power unit operated within defined parameters during the testing period may include receiving a fault signal from the secondary power unit that indicates the secondary power unit was not able to provide a threshold current or voltage during the test period. The method may include providing an alert for the secondary power unit. The DC load may include at least one processor and the method may include controlling an operation of the processor in response to receiving the fault signal. Controlling the operation of the processor may include preventing the processor from processing jobs designated as critical.

In another aspect, a method of controlling a power delivery system that includes multiple power supply systems, each of the power supply systems including a power supply unit configured to receive primary power and provide operating DC power to a DC load and a secondary power unit configured to receive power from the primary power, store energy from the primary power, and, when the primary power is outside of a specified operating range, use the stored energy to provide secondary DC power to the load instead of the operating DC power includes: selecting one or more of the power supply systems for testing; controlling the secondary power unit of each of the selected power supply systems such that the secondary power unit uses the stored energy to provide secondary DC power to the load instead of the operating DC power while the primary power is received by the power supply unit and is within the specified operating range; and receiving a signal, for each of the selected power supply systems, indicative of whether the corresponding secondary power unit operated within defined parameters during the testing period.

Implementations may include one or more of the following features. For example, each of the power supply units may include a selection circuit. The selection circuit may be configured to select between power from the primary power and power from the secondary power unit. The selected power may be provided to the corresponding DC load and the selection circuit may be configured to select the power from the secondary power unit when a voltage of the power from the secondary power unit is higher than a voltage of the power from the primary power. Controlling the secondary power unit of each of the selected power supply systems may include controlling the secondary power unit such that the voltage of the power from the secondary power unit is higher than the voltage of the power from the primary power.

At least one the selection circuits may include a first diode and a second diode. The anode of the first diode may be configured to receive power from the primary power and the cathode of the first diode may be configured to provide power to a node. The anode of the second diode may be configured to receive power from the secondary power unit and the cathode of the second diode may be configured to provide power to the node.

The DC load may include one or more processors. Receiving a signal, for each of the selected power supply systems, indicative of whether the corresponding secondary power unit operated within defined parameters may include receiving a fault signal from at least one of the power supply systems that indicates the corresponding secondary power unit was not able to provide a threshold current or voltage during the test period. The method may include providing an alert for the power supply system that sent the fault signal. The DC load associated with the power supply system that sent the fault signal may include at least one processor and the method may include controlling an operation of the processor in response to receiving the fault signal. Controlling the operation of the processor includes preventing the processor from processing jobs designated as critical.

The details of one or more implementations are set forth in the accompanying drawings and the description below. Other features, aspects, and will become apparent from the description, the drawings, and the claims.

DETAILED DESCRIPTION

Figure 1:
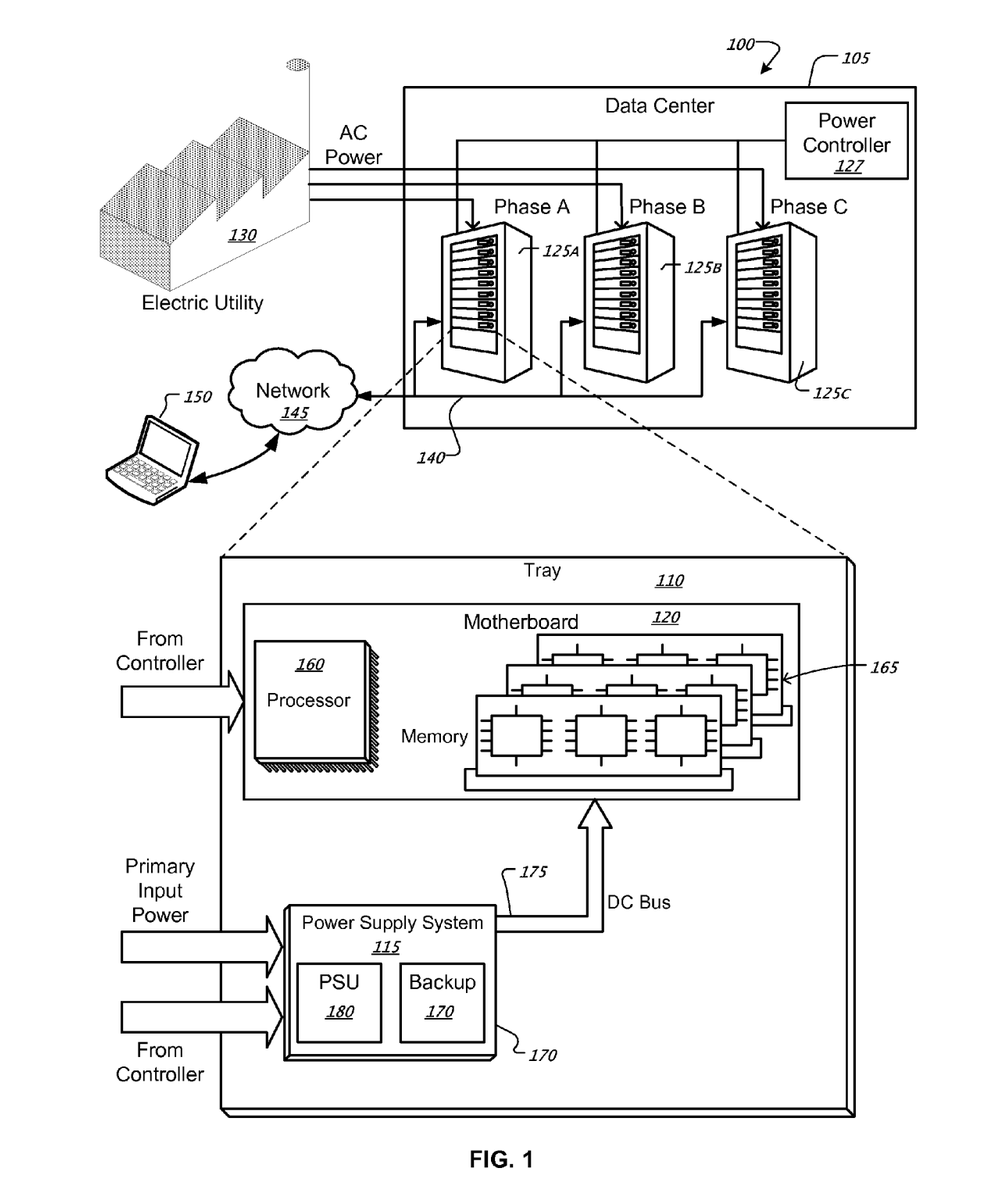
FIG. 1 is a schematic diagram illustrating an example of a power distribution architecture for a data center.

FIG. 1 is a schematic diagram illustrating an example of a power distribution architecture 100 for a data center 105 in which each of a number of modular rack-mounted bases (which may also be referred to as trays) 110 includes a power supply system 115 operating to power components on a computer motherboard 120, such as a processor 160 and memory 165. The power supply system 115 includes a primary power unit, such as power supply unit (PSU) 180 and a secondary power unit, such as a backup unit 170. As will be explained in more detail below, the configuration of the backup unit 170 and the power supply unit 180 allows on line testing of the backup unit 170 to ensure it will provide power when the primary input power 185 is outside of the specified operating range.

In the depicted example, the data center 105 includes a number of racks 125A, 125B, 125C that contain a number of the trays 110. The racks 125A-125C may be coupled to the AC mains to receive AC power that is delivered to the data center 105 from an electric utility 130. In this example, AC mains refers to the AC power source available at the point of use in the data center 105. In some cases, the AC mains voltage may be delivered to the racks (or directly to the power supply system 115) "substantially unconditioned," indicating that the AC mains does not have a traditional UPS system or other sort of traditional signal conditioning system with harmonic filtering, noise filtering, or sag protection. Substantially unconditioned AC power may, of course, pass through various circuits typically provided by an electric utility or data center 105 such as, for example, transformers, fuses, and surge protectors such as the typical metal-oxide or silicon-gapped surge arrestors provided by many electric utility providers or large generator systems.

The AC power delivered to each of the racks 125A-125C may originate from a rotating generator operated by the electric utility and driven by a steam or gas turbine, for example. The AC voltage signals, which are substantially sinusoidal (e.g., 50 Hz, 60 Hz), may be transmitted to a distribution point, such as a substation (not shown) in the utility grid, for example. The power line voltages (e.g., 480 V line-to-line) may be distributed from the substation to the data center 105.

The AC power received from the electric utility 130 may be three phase power. In the data center 105, individual phase voltages (e.g., 230 or 277 V line-to-neutral) are routed to the individual racks 125A-125C. Suitable AC-to-AC transformers (not shown) may be employed, as necessary, to deliver the AC power at a specified AC voltage. For example, step-down transformers may transform high voltage levels suitable for transmission to lower voltage levels that can be substantially directly applied to the power supply system 115. In some three phase configurations, for example, such transformers may make appropriate transformations between WYE and DELTA connections if required.

In some implementations, the AC power signal received by the data center 105 is substantially unconditioned, containing a low power factor (e.g., a ratio between real power and apparent power) and harmonic components. For example, the electric utility grid may introduce harmonics and noise into the AC power signal. In some implementations, the power supply system 115 provides power to multiple trays such as the tray 110, to an entire rack such as the rack 125A, or to multiple racks.

Unless otherwise indicated, references to AC voltages are understood to refer to substantially sinusoidal voltages, and voltage amplitudes are understood to refer to root mean square (r.m.s.) values. The utility 130 may deliver substantially symmetric three phase voltages suitable for powering substantially balanced three phase loads.

The data center 105 includes a power controller 127. In some implementations, the data center 105 includes multiple power controllers. The power controller 127 is communicatively connected to the motherboards 120 in the racks 125A-125C. For example, the power controller 127 may communicate with the motherboard 120 to analyze and control the amount of power consumed by the motherboard 120. In some implementations, the power controller 127 communicates with the motherboard 120 to determine the present power state (e.g., on, sleeping, low power) and/or computing load. For example, power consumption by the motherboard 120 may be related to the processing load of the motherboard 120. As such, the power controller 127 may determine that the motherboard 120 is operating at 50% of its processing capacity, and use that information to estimate that the motherboard 120 is drawing 2A of current. The power controller 127 may, at another time, determine that the motherboard 120 is operating at 100% of its processing capacity, and use that information to estimate that the motherboard 120 is drawing 3A of current.

In some implementations, the power controller 127 communicates with the motherboard 120 to alter the power consumption of the motherboard 120. For example, the power controller 127 may request the motherboard 120 to enter a reduced power consumption state. In another example, the power controller 127 may request the motherboard 120 to limit its processing load, which may also reduce the amount of power consumed by the motherboard 120.

In the depicted example, one phase voltage and a neutral line are distributed to each of the racks 125A-125C. The racks 125A-125C and trays 110 may be configured to form a substantially balanced load. In other implementations, a similar distribution may be used if the data center 105 included additional (or fewer) racks 125A-125C. As an example, the exemplary tray 110 (shown in magnified detail) in the rack 125A receives a phase A voltage and the neutral line. In some implementations, each of the trays 110 in the rack 125A receives the same AC input voltage signal, namely the Phase A-to-neutral voltage.

Similarly, each of the trays 110 in the rack 125B receives a Phase B-to-neutral voltage signal as the AC input voltage signal, and each of the trays 110 in the rack 125C receives Phase C-to-neutral voltage signal as the AC input voltage signal. In other implementations, different phase voltages may be distributed among the trays 110 in one of the racks 125A-125C, and/or the AC input voltage signal to each of the trays 110 may be line-to-line voltages instead of line-to-neutral voltages. In various implementations, any practical number of phases (e.g., 1, 2, 3, 4, 5, 6, . . . 12 or more) may be distributed to provide operating power to individual trays 110.

Each of the trays 110 in the depicted example is coupled to a network connection 140. The network connection 140 provides an information channel to a network 145, which may include, for example, a local area network, virtual private network, wide area network (e.g., the Internet), or a combination of such networks, which may be wired, fiber optic, and/or wireless. A remote computer 150 represents one of many possible devices that could communicate data directly or indirectly with one or more trays to access, store, process, and/or retrieve information using a processor 160 and associated memory 165 on the motherboard 120. In some implementations, additional processors (e.g., servers) may facilitate such communication. For example, the exemplary remote computer device 150 may be included in a server, a desktop computer, a laptop computer, and/or a handheld processor-based device. One or more servers may pre- or post-process, supervise, route, and/or balance the flow of data associated with the communication.

In various implementations, the motherboard 120 may include two, three, four, or any other practicable number of processors 160. In some implementations, the motherboard 120 may be replaced with or augmented by a tray of data storage devices (e.g., hard disc drives, flash memory, RAM, or any of these or other types of memory in combination).

In various implementations, a digital processor may include any combination of analog and/or digital logic circuits, which may be integrated or discrete, and may further include programmable and/or programmed devices that may execute instructions stored in a memory. The memory 165 may include volatile and/or non-volatile memory that may be read and/or written to by the processor 160. The motherboard 120 may further include some or all of a central processor unit(s) (CPU), memory (e.g., cache, non-volatile, flash), and/or disk drives, for example, along with various memories, chip sets, and associated support circuitry.

In some implementations, the motherboard 120 provides one or more DC-to-DC conversion circuits to convert the DC bus voltage to a suitable voltage for operating the circuitry in the motherboard 120. For example, one or more DC-to-DC conversion circuits may provide regulated output voltages, which may include, for example, a +3.3VDC power signal, a +5VDC power signal, a −5VDC power signal, a +12VDC power signal, and a −12VDC power signal.

In an exemplary implementation, the processor 160 and the memory 165 on the motherboard 120 may form at least a part of a processing system configured to handle network operations. As an illustrative example, the motherboard 120 may help to process Internet requests. The motherboard may process information either alone or in combination with other parallel processes running on other processor-based devices, such as one or more other trays 110 in the data center 105.

As noted above, the trays 110 include a power supply system 115 to provide power to the components on the motherboard 120. In general, the power supply system 115 includes a power supply unit 180 configured to receive primary input power 185 and provide operating DC power to a DC load, such as the processor 160 and/or memory 165 on the motherboard 120, using the DC bus 175. The power supply system 115 also includes a backup unit 170 configured to receive power from the primary input power 185, store energy from the input power 185, and, when the input power 185 is outside of a specified operating range, use the stored energy to provide backup DC power to the load 120 instead of the operating DC power.

Depending on the configuration of the data center 105, the primary input power 185 can be an AC input voltage or a DC input voltage. The specified operating range of the primary input power can be designated in various ways. For instance, in some implementations, the primary input power 185 may be supplied directly from the AC mains as a sinusoidal AC signal. The specified operating range can be designated in such a case, for example, by defining one or more thresholds between about 80 V and 500 V for line frequencies that may be between about 40 Hz and 1000 Hz, such as around 50 Hz, 60 Hz, 100 Hz, 120 Hz, 180 Hz, 200 Hz, 300 Hz, 400 Hz, 500 Hz, . . . , and up to about 1000 Hz or more. As an illustrative example, for a 120 V nominal AC input voltage signal, a fault may be identified if the AC peak input voltage falls below a first threshold of 90 V in any half cycle, or if the r.m.s. voltage drops below a second threshold of 100 V for a predetermined amount of time.

The input power 185 may go outside of the specified operating range as a result of a fault condition. Fault conditions that result in power being supplied by the backup unit 170 may include, without limitation, blackouts, brownouts, voltage sags, surges, instabilities related to switchgear operation, or other electrical transient associated with the AC mains. In some implementations, a fault condition may cause, or potentially cause, improper operation of a processing unit in the DC load.

The configuration of the backup unit 170 and power supply unit 180 allows on line testing of the backup unit 170. In other words, the operation of the backup unit 170 can bet tested while the processor 160 continues to operate and while the primary input power 185 is received by the power supply unit 180 and is within the specified operating range. Depending on the technology used to store energy in the backup unit 170, the backup unit 170 may appear to be capable of providing adequate backup power when a fault condition occurs, even though the backup unit 180 is not able to do so. For example, in certain circumstances, a lead-nickel battery may appear as if it can provide adequate power when not under load, but as soon as the lead-nickel battery is loaded, it may fail. This may occur when the battery has aged a certain amount. In system 100, the backup unit 170 and the power supply unit 180 are designed to provide for the testing of the backup unit 170 without disconnecting the power supply system 115 from the primary input power 185, and without causing the load (for example, processor 160 and memory 165) to stop operating. The operation of the backup unit 170 can then be monitored during the testing period and a signal can be provided that indicates whether the backup unit 170 operated within defined parameters during the testing period In some implementations, the power controller 127 provides a signal to the power supply system 115 to test the backup unit 170. For instance, the signal may control the backup unit 170 during the testing period such that the backup unit 170 uses the stored energy to provide backup DC power to the load instead of the operating DC power while the primary input power 185 is received by the power supply unit 115 and is within the specified operating range. A monitor may monitor the operation of the backup unit 170 during the testing period and provide a signal indicative of whether the backup unit 170 operated within defined parameters during the testing period, with the signal being received by the power controller 127.

In certain circumstances, the power controller 127 can test the backup units 170 of multiple trays while the entire system remains online. For instance, the power controller 127 can select one or more of the power supply systems 115 for testing. For each of the selected power supply systems 115, the controller 127 can cause the respective backup unit 170 to provide backup DC power to the load instead of the operating DC power even though the input power 185 is being received and is within the specified operating range. A monitor on each of the power supply systems 115 may then monitor the operation of the corresponding backup unit 170 and send a signal indicative of whether the corresponding backup unit 170 operated within defined parameters during the testing period. This can be done simultaneously for each selected power supply system 115, with each backup circuit 170 being tested individually, even though multiple backup units 170 are tested simultaneously.

In some implementations, the data center 105 includes up to or more than 100 trays. For example, the data center 105 may include more than 10,000 processor cores. In some examples, the data center 105 may execute more than 20,000 threads simultaneously. In certain implementations, the data center 105 may include an aggregate of more than 100,000 cores, 300 terabytes of memory and 3 petabytes of data storage. In other implementations, the data center 105 includes millions of cores and thousands of terabytes of memory and hundreds of petabytes of data storage.

In some examples, the data center 105 draws a large amount of power from the electric utility 130. For example, each server system in the data center 105 may consume 100 W-500 W of power. For example, each of the racks 125A-C may consume 2 kW to 30 kW of power. A small data center may provide, for example, 5000 processors, each having one or more cores. As processor technology improves, each processor or core may draw less power, but the number of cores per processor may increase. Larger data centers may employ many more processors, including 10,000, 20,000, 50,000, or even 100,000 processors. These may be distributed in racks having, for example, 20 to 200 processors or more per rack.

Figure 2:
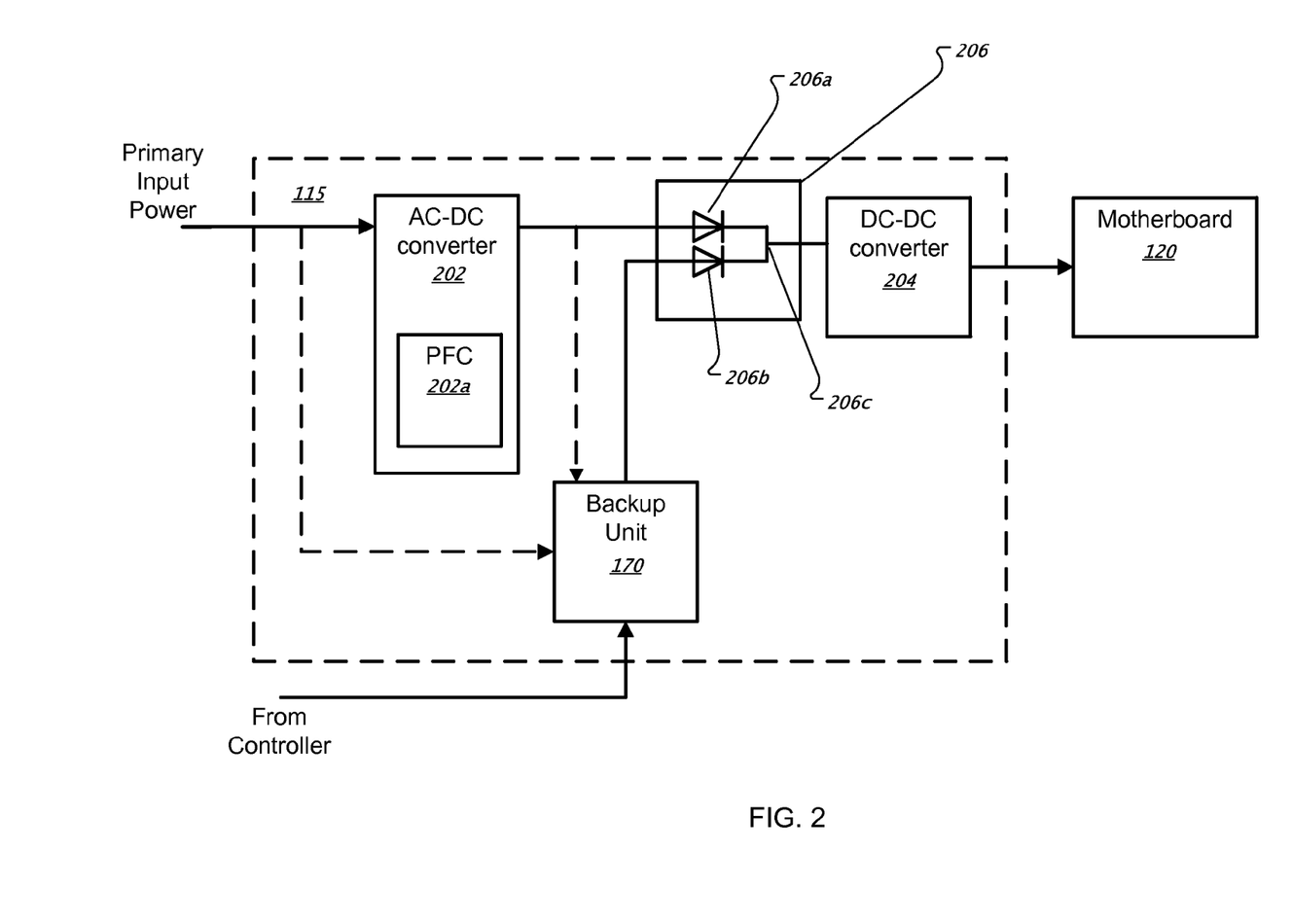
FIG. 2 is a block diagram that illustrates an example of an implementation of a power supply system.

FIG. 2 is a block diagram that illustrates an example of an implementation of the power supply system 115. In this implementation, the power supply system 115 includes an AC/DC converter stage 202, a DC/DC converter stage 204, a selection circuit 206, and the backup unit 170.

The AC/DC converter 202 stage receives the primary input power 185 in the form of an AC power signal and converts the received AC input power to DC power. For example, the AC/DC converter stage 202 may receive a 240V AC input signal as the primary input power, and convert that 240V AC signal into an approximately 400V DC power signal. The AC/DC converter stage 202 includes a power factor correction (PFC) circuit 202a that performs power factor correction on the input AC signal. The PFC circuit 202a has the ability to control the amount of current drawn from the primary input power 185 on a cycle by cycle basis. For instance, the PFC circuit 202a may include logic and circuitry to limit the peak current drawn to a predefined value.

The DC power from the AC/DC converter stage is provided to the selection circuit 206. During normal operation (for example, not during a testing period or a fault condition), the selection circuit 206 provides the DC power from the AC/DC converter stage 202 to DC/DC converter stage. The DC/DC converter stage 204 is configured to receive the DC power from the AC/DC stage and convert the received DC power to the operating DC power. For instance, the DC/DC converter stage 204 converts a 400V DC signal to a 12V DC signal. The operating power is provided to the load, such as motherboard 120.

The DC power from the AC/DC converter stage is also provided to the backup unit 170. The backup unit 170 stores energy from the DC power received from the AC/DC converter stage 202 so that the energy can be used to supply power to the DC/DC converter stage 204 during a fault condition or other circumstances that cause the primary input power 185 to be outside of the specified range. For example, backup unit 170 may monitor the primary input power 185 to determine when the primary input power is operating outside of a specified range, such as when a fault condition occurs. When the primary input power 185 is operating outside of a specified range, the backup unit 170 provides the needed backup power to the selection circuit 206. In this circumstance, the selection circuit 206 provides the backup power to the DC/DC converter stage 204, which converts this power to DC operating power.

During a test period, the power supply system 115 is controlled such that both the AC/DC converter stage 202 and the backup unit 170 provide power to the selection circuit 206. The selection circuit 206 is configured to select between the DC power provided by the AC/DC stage and the backup DC power provided by the backup unit 170. The selected power is provided to the DC/DC converter stage 204 to be used to generate the DC operating power.

In some implementations, the selection circuit is configured to select between the power from the AC/DC converter stage 202 and the power from the backup unit 170 based on characteristics of the power from the AC/DC converter stage 202 and the power from the backup unit 170. For instance, the characteristics may be the voltage of the power from the AC/DC converter stage 202 and the voltage of the power from the backup unit 170, In particular, for example, the selection circuit in the implementation shown includes a first diode 206a and a second diode 206b. The anode of the first diode 206a is configured to receive the DC power from the AC/DC converter stage 202 and the cathode of the first diode 206a is configured to provide power to a node 206c. The anode of the second diode 206b is configured to receive power from the backup unit 170 and the cathode of the second diode is configured to provide power to the node 206c. The node 206c is connected to the input of the DC/DC converter stage 204. In some cases, the functionality of the diodes 206a or 206b may be implemented using MOSFETs or other semiconductor devices. Doing so may reduce the energy loss relative to using diodes by making the voltage drop across the relevant junction as small as possible.

In this arrangement, the selection circuit 206 is configured to select the signal with the higher voltage. For instance, if the voltage provided by the AC/DC converter stage 202 is 400V DC and the voltage from the backup unit 170 is 350V DC, then substantially all of the power to the DC/DC converter stage 204 is supplied by the AC/DC converter stage 202 because the first diode 206a is on and the second diode 206b is off. On the other hand, for example, if the voltage provided by the AC/DC converter stage 202 is 400V DC and the voltage from the backup unit 170 is 450V DC, then all of the power to the DC/DC converter stage 204 is supplied by the backup unit 170 because the first diode 206a is on and the second diode 206b is off.

The power controller 127 has the ability to control the voltage provided by the backup circuit 170. Accordingly, during a test period, the power controller circuit 127 adjusts the voltage provided by the backup circuit 170 to be greater than the voltage provided by the AC/DC converter stage 202, thereby causing the backup unit 170 to supply substantially all of the power to the DC/DC converter stage 204 and, hence, the load 120. Following the example above, the power controller 127 may cause the backup unit 170 to output a 450V DC signal for a certain period of time to test the backup unit 170. Because of the operation of the selection circuit 206, the backup unit 170 can be tested even while the primary input power 185 is being supplied to the power supply system 115. If the backup unit 170 fails during the test period, then the voltage provided by the backup unit 170 will drop, causing the AC/DC converter stage 202 to provide the power to DC/DC converter stage 204 again (because the first diode 206a will turn on while the second diode 206b will turn off).

Other implementations may place the AC/DC converter stage 202 off tray. For instance, each rack may have one or more AC/DC converter systems with PFC and supply DC power (for example, a 400V DC signal) directly to each tray. In this case, the primary input power is DC and may be fed directly into the selection circuit 206 and backup 170. Similarly, the DC/DC converter stage 204 may be placed off tray and supply multiple trays. For instance, a single AC/DC converter stage 202 may supply DC power to a rack with three sections. Each section may include a DC/DC converter stage 204 that supplies operating DC power to all of the trays in section.

In other implementations, the power controller 127 may control the selection circuit 206 directly, rather than control the selection circuit 206 indirectly by changing the voltage provided by the backup unit 170. Similarly, in some cases the backup unit 170 may control the selection circuit directly to switch between the selected power. In such a scenario, the power controller 127 may send commands to the backup unit 170 to control the switch state, with the backup unit 170 interpreting those commands and directly controlling the selection circuit 206 as appropriate.

Figure 3:
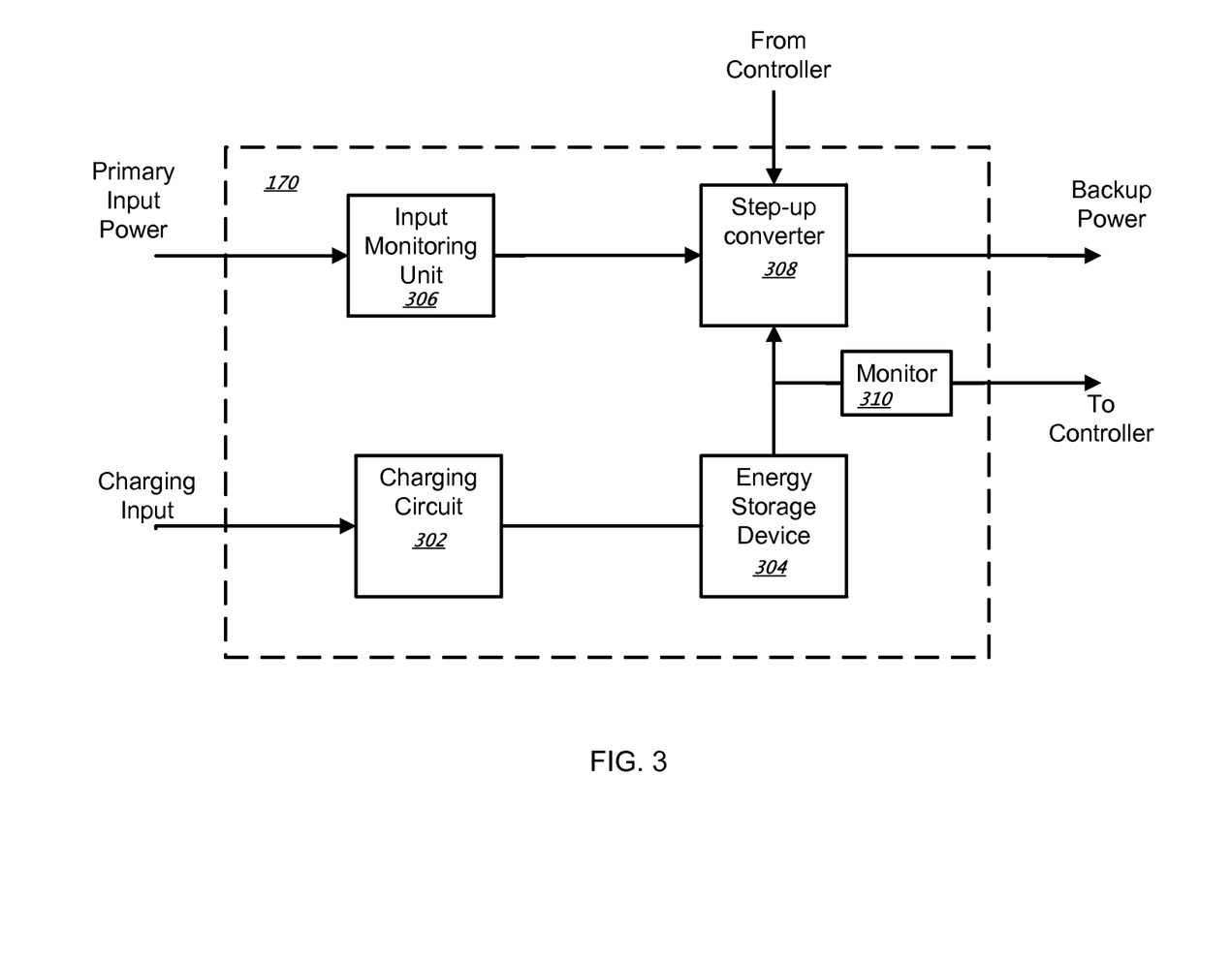
FIG. 3 is a block diagram illustrating an example of a backup unit.

FIG. 3 is a block diagram illustrating an example of a backup unit 170. In this implementation, the backup unit 170 includes a charging circuit 302, an energy storage device 304, an input monitoring unit 306, a step-up converter 308, and a monitor 310.

The charging circuit 302 receives charging power from a charging input. The charging power may be supplied, for example, directly from the primary input power 185 or from the DC power provided by the AC/DC. The charging circuit 302 uses the charging power to charge the energy storage device 304 such that the energy storage device 304 stores energy. For example, if the energy storage device 304 is a rechargeable battery, then the charging circuit 302 may control the voltage and current supplied to the energy storage device 304 so as to most efficiently charge the rechargeable battery without damaging the battery's storage capabilities.

The input monitoring unit 306 monitors the primary input power 185 to detect if the primary input power 185 is operating outside of the specified operating range. For instance, the input monitoring unit 306 may monitor the input power signal to detect when the voltage goes above or below a certain threshold. For AC power signals, the input monitoring unit 306 may monitor the peak voltage, the r.m.s. voltage, or both.

When the input monitoring unit 306 detects that the primary input power 185 is outside of the specified operating range, the input monitoring unit 306 activates the step-up converter 308. The step-up converter 308 steps up the voltage provided by the energy storage device 304 to an appropriate voltage for input into the selection circuit 206 and ultimately the DC/DC converter stage 204. The resulting signal is provided as the backup power. For example, the step-up converter 308 may step up the voltage to 400V DC when activated by the input monitoring unit 306.

During a testing period, the power controller 127 may control the backup unit 170 so that the backup unit 170 provides power to the DC/DC converter stage 204. For instance, when the selection circuit 206 is used, the controller 127 may activate the step-up converter 308 and control the step-up converter 308 such that the backup power signal has a voltage that results in the backup power signal being applied to the DC/DC converter stage instead of the power signal from the AC/DC converter stage 202, a described with respect to FIG. 2.

During the test period, the monitor 310 may monitor the voltage or current provided by the energy storage device 306 to insure the energy storage device 306 is operating within defined parameters (for example, maintains a minimum voltage and/or current). The monitor 310 then sends a signal to the controller to indicate whether the energy storage device 304 is operating within the defined parameters.

In other implementations, the monitor 310 may instead monitor the voltage or current provided by the DC/DC converter stage 204 to determine whether the energy storage device 304 is operating within the defined parameters. Alternatively, or additionally, the energy storage device 304 may be separate from the backup unit 170 and/or not charged by the primary input power or AC/DC converter stage 202. For instance, the energy storage device 304 may be based on energy technologies such as wind, photovoltaic, or fuel cell.

Figure 4:
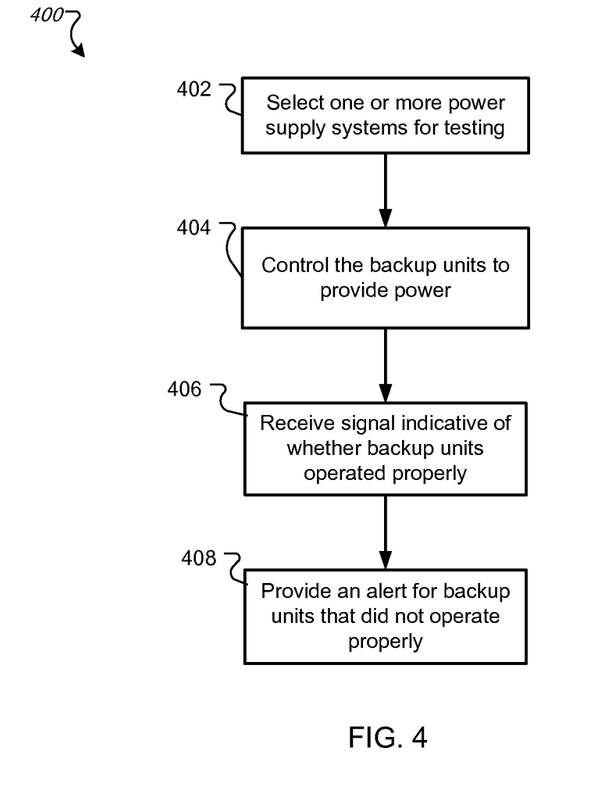
FIG. 4 is a flowchart illustrating a process that may be used to perform online testing of backup units.

FIG. 4 is a flowchart illustrating a process 400 that may be used to perform online testing of backup units. The following describes the process 400 as being performed by system 100 with the power supply system implementation shown in FIG. 2, but other systems or configurations may be used.

The power controller selects one or more power supply systems for testing (402). For instance, the power controller 127 may periodically select a different subset of the power supply systems 115 to test, with the subsets being chosen such that all backup units 170 are tested after a certain period. Alternatively, or additionally, the power controller 170 may select those backup units 170 that have energy storage devices over a certain age (for example, those with lead-nickel batteries that have reached a certain age at which they become significantly less reliable).

The controller 127 then controls the selected backup units 170 to provide power to the loads (404). For instance, the controller 127 may control each backup unit 170 such that the backup unit 170 provides a power signal with a voltage higher than the voltage provided by the signal from the AC/DC converter stage 202. As a result, the selection circuit 206 causes substantially all of the power to the DC/DC converter stage 204 to be provided by the backup unit 170. This may be done while the primary input power is still connected to the corresponding power supply systems 115 and the processor and memory are still operating.

For each backup unit, the controller 127 receives a signal indicative of whether the backup unit 170 operated properly (for example, within defined parameters) (406). For instance, a monitor may determine whether the backup unit 170 was able to provide a threshold current or voltage during the test period and, if so, provide a signal that indicates the backup unit 170 is healthy. If the backup unit 170 was not able to maintain threshold current or voltage, the monitor may send a signal that indicates the backup unit 170 did not operate properly.

The controller 127 provides an alert for those backup units 170 that did not operate properly (408). For instance, the alert can be displayed on a screen of a monitoring station, or alerts can be sent through a messaging medium such as e-mail or SMS. The controller 127 may take additional action. For instance, the controller may control the operation of processor 160 or the assignment of jobs to processor 160 such that the processor 160 is not processing any jobs, or at least not critical jobs. For example, the controller 127 may instruct the processor 160 to go into a sleep mode or to otherwise not accept any new processing tasks.

A number of implementations have been described. Nevertheless, it will be understood that various modifications may be made. For example, while the foregoing describes a power controller that may select certain backup units for testing, a separate unit overseeing the testing may not be included. Instead, for instance, each power supply system may include some logic for deciding when to conduct testing of its associated backup unit, test the backup unit in a manner as described above, and then report the results to an external computer or other system on the network (or at least report when the backup unit fails). Accordingly, other implementations are within the scope of the following claims.

What is claimed is:

1. A power delivery system comprising:
    a power supply unit configured to receive primary power and provide operating DC power to a DC load, wherein the power supply comprises a selection circuit, the selection circuit being configured to select between power from the primary power and secondary power from the secondary power unit, the selection circuit being configured to provide the selected power to the DC load, wherein the selection circuit is configured to select the secondary power when the voltage of the secondary power is higher than the voltage of the power from the primary power based on characteristics of the power from the primary power and the secondary power, the characteristics including the voltage of the power from the primary power and the voltage of the secondary power;
    a secondary power unit configured to receive power from the primary power, store energy from the primary power, and, when the primary power is outside of a specified operating range, use the stored energy to provide secondary DC power to the load instead of the operating DC power;
    a controller configured to control the secondary power unit during a testing period such that the secondary power unit uses the stored energy to provide secondary DC power to the load instead of the operating DC power while the primary power is received by the power supply unit and is within the specified operating range such that the voltage of the secondary power is higher than the voltage of the power from the primary power; and a monitor configured to monitor the operation of the secondary power unit during the testing period and provide a signal indicative of whether the secondary power unit operated within defined parameters during the testing period.

2. The system of claim 1, wherein the selection circuit comprises:
 a first diode having an anode and a cathode, wherein the anode of the first diode is configured to receive power from the primary power and the cathode of the first diode is configured to provide power to a node; and
 a second diode having an anode and a cathode, wherein the anode of the second diode is configured to receive power from the secondary power unit and the cathode of the second diode is configured to provide power to the node.

3. The system of claim 1, wherein the DC load includes one or more processors.

4. The system of claim 1, wherein the secondary power unit comprises:
 a charger configured to receive power;
 an energy storage device configured to receive power from the charger and store energy from the received power;
 a step-up converter configured to receive power from the energy storage medium and deliver power to the selection circuit; and
 a primary monitoring unit configured to monitor the primary power and to control the converter based on a state of the primary power.

5. A power delivery system comprising:
 a power supply unit configured to receive AC input power as primary power and provide operating DC power to a DC load;
 a secondary power unit configured to receive power from the primary power, store energy from the primary power, and, when the primary power is outside of a specified operating range, use the stored energy to provide secondary DC power to the load instead of the operating DC power;
 a controller configured to control the secondary power unit during a testing period such that the secondary power unit uses the stored energy to provide secondary DC power to the load instead of the operating DC power while the primary power is received by the power supply unit and is within the specified operating range; and
 a monitor configured to monitor the operation of the secondary power unit during the testing period and provide a signal indicative of whether the secondary power unit operated within defined parameters during the testing period;
 wherein the power supply unit includes:
  an AC/DC stage configured to receive the AC input power and convert the received AC input power to DC power;
  a DC/DC stage configured to receive the DC power from the AC/DC stage and convert the received DC power to the operating DC power; and
  a selection circuit, the selection circuit being configured to select between the DC power from the AC/DC stage and the secondary DC power from the secondary power unit, the selection circuit being configured to provide the selected power to the DC/DC stage, wherein the selection circuit is configured to select between the DC power from the AC/DC stage and the secondary DC power from the secondary power unit based on characteristics of the DC power from the AC/DC stage and the secondary DC power from the secondary power unit.

6. The system of claim 5 wherein:
 the characteristics include the voltage of the DC power from the AC/DC stage and the voltage of the secondary DC power from the secondary power unit;
 the selection circuit is configured to select the secondary DC power when the voltage of the secondary DC power is higher than the voltage of the DC power from the AC/DC stage; and
 the controller is configured to control the secondary power unit during the testing period such that the voltage of the secondary DC power is higher than the voltage of the power from the AC/DC stage.

7. The system of claim 5, wherein the selection circuit comprises:
 a first diode having an anode and a cathode, wherein the anode of the first diode is configured to receive power from the primary power and the cathode of the first diode is configured to provide power to a node; and
 a second diode having an anode and a cathode, wherein the anode of the second diode is configured to receive power from the secondary power unit and the cathode of the second diode is configured to provide power to the node.

8. The system of claim 5, wherein the DC load includes one or more processors.

9. The system of claim 5, wherein the secondary power unit comprises:
 a charger configured to receive power;
 an energy storage device configured to receive power from the charger and store energy from the received power;
 a step-up converter configured to receive power from the energy storage medium and deliver power to the selection circuit; and
 a primary monitoring unit configured to monitor the primary power and to control the converter based on a state of the primary power.

10. A method of controlling a power delivery system that includes a power supply unit configured to receive primary power and provide operating DC power to a DC load, a secondary power unit configured to receive power from the primary power, store energy from the primary power, and, when the primary power is outside of a specified operating range, use the stored energy to provide secondary DC power to the load instead of the operating DC power, and a selection circuit, the selection circuit being configured to select between power from the primary power and power from the secondary power unit, the selected power being provided to the DC load and the selection circuit being configured to select the power from the secondary power unit when a voltage of the power from the secondary power unit is higher than a voltage of the power from the primary power, the method comprising:
 controlling the secondary power unit during a testing period such that the secondary power unit uses the stored energy to provide secondary DC power to the load instead of the operating DC power while the primary power is received by the power supply unit and is within the specified operating range such that the voltage of the power from the secondary power unit is higher than the voltage of the power from the primary power; and
 receiving a signal indicative of whether the secondary power unit operated within defined parameters during the testing period.

11. The method of claim 10, wherein the selection circuit comprises:
 a first diode having an anode and a cathode, wherein the anode of the first diode is configured to receive power from the primary power and the cathode of the first diode is configured to provide power to a node; and a second diode having an anode and a cathode, wherein the anode of the second diode is configured to receive power from the secondary power unit and the cathode of the second diode is configured to provide power to the node.

12. The method of claim 10, wherein the DC load includes one or more processors.

13. The method of claim 10 wherein receiving the signal indicative of whether the secondary power unit operated within defined parameters during the testing period includes receiving a fault signal from the secondary power unit that indicates the secondary power unit was not able to provide a threshold current or voltage during the test period, the method comprising providing an alert for the secondary power unit.

14. The method of claim 10 wherein
receiving the signal indicative of whether the secondary power unit operated within defined parameters during the testing period includes receiving a fault signal from the secondary power unit that indicates the secondary power unit was not able to provide a threshold current or voltage during the test period; and
the DC load includes at least one processor,
the method comprising controlling an operation of the processor in response to receiving the fault signal.

15. The method of claim 14 wherein controlling the operation of the processor includes preventing the processor from processing jobs designated as critical.

16. A method of controlling a power delivery system that includes a power supply unit configured to receive AC input power as primary power and provide operating DC power to a DC load and a secondary power unit configured to receive power from the primary power, store energy from the primary power, and, when the primary power is outside of a specified operating range, use the stored energy to provide secondary DC power to the load instead of the operating DC power, wherein
the power supply unit includes:
an AC/DC stage configured to receive the AC input power and convert the received AC input power to DC power;
a DC/DC stage configured to receive the DC power from the AC/DC stage and convert the received DC power to the operating DC power; and
a selection circuit, the selection circuit being configured to select between the DC power from the AC/DC stage and the secondary DC power from the secondary power unit, wherein the selected power is provided to the DC/DC stage and the selection circuit is configured to select the secondary DC power from the secondary power unit when a voltage of the secondary DC power is higher than a voltage of the DC power from the AC/DC stage;
the method comprising:
controlling the secondary power unit during the testing period such that the secondary power unit uses the stored energy to provide secondary DC power to the load instead of the operating DC power while the primary power is received by the power supply unit and is within the specified operating range such that the voltage of the secondary DC power from the secondary power unit is at a specified level above the DC power provided by the AC/DC stage; and
receiving a signal indicative of whether the secondary power unit operated within defined parameters during the testing period.

17. The method of claim 16 wherein receiving the signal indicative of whether the secondary power unit operated within defined parameters during the testing period includes receiving a fault signal from the secondary power unit that indicates the secondary power unit was not able to provide a threshold current or voltage during the test period, the method comprising providing an alert for the secondary power unit.

18. The method of claim 16 wherein:
receiving the signal indicative of whether the secondary power unit operated within defined parameters during the testing period includes receiving a fault signal from the secondary power unit that indicates the secondary power unit was not able to provide a threshold current or voltage during the test period; and
the DC load includes at least one processor,
the method comprising controlling an operation of the processor in response to receiving the fault signal.

19. The method of claim 18 wherein controlling the operation of the processor includes preventing the processor from processing jobs designated as critical.

20. A method of controlling a power delivery system that includes multiple power supply systems, each of the power supply systems including a power supply unit having a selection circuit and configured to receive primary power and provide operating DC power to a DC load and a secondary power unit configured to receive power from the primary power, store energy from the primary power, and, when the primary power is outside of a specified operating range, use the stored energy to provide secondary DC power to the load instead of the operating DC power, the selection circuit being configured to select between power from the primary power and power from the secondary power unit, the selected power being provided to the corresponding DC load and the selection circuit being configured to select the power from the secondary power unit when a voltage of the power from the secondary power unit is higher than a voltage of the power from the primary power and, the method comprising:
selecting one or more of the power supply systems for testing;
controlling the secondary power unit of each of the selected power supply systems such that the secondary power unit uses the stored energy to provide secondary DC power to the load instead of the operating DC power while the primary power is received by the power supply unit and is within the specified operating range such that the voltage of the power from the secondary power unit is higher than the voltage of the power from the primary power; and
receiving a signal, for each of the selected power supply systems, indicative of whether the corresponding secondary power unit operated within defined parameters during the testing period.

21. The method of claim 20, wherein at least one the selection circuits comprise:
a first diode having an anode and a cathode, wherein the anode of the first diode is configured to receive power from the primary power and the cathode of the first diode is configured to provide power to a node; and
a second diode having an anode and a cathode, wherein the anode of the second diode is configured to receive power from the secondary power unit and the cathode of the second diode is configured to provide power to the node.

22. The method of claim 20, wherein the DC load includes one or more processors.

23. The method of claim 20 wherein receiving a signal, for each of the selected power supply systems, indicative of whether the corresponding secondary power unit operated within defined parameters includes receiving a fault signal from at least one of the power supply systems that indicates the corresponding secondary power unit was not able to provide a threshold current or voltage during the test period.

24. The method of claim 23 comprising providing an alert for the power supply system that sent the fault signal.

25. The method of claim 23 wherein the DC load associated with the power supply system that sent the fault signal includes at least one processor, the method comprising controlling an operation of the processor in response to receiving the fault signal.

26. The method of claim 25 wherein controlling the operation of the processor includes preventing the processor from processing jobs designated as critical.

* * * * *